United States Patent [19]

Trout et al.

[11] Patent Number: 4,963,471
[45] Date of Patent: Oct. 16, 1990

[54] HOLOGRAPHIC PHOTOPOLYMER COMPOSITIONS AND ELEMENTS FOR REFRACTIVE INDEX IMAGING

[75] Inventors: Torence J. Trout, Yorklyn; Dominic M. Chan; Bruce M. Monroe, both of Wilmington, all of Del.

[73] Assignee: E. I. Du Pont de Nemours and Company, Wilmington, Del.

[21] Appl. No.: 380,840

[22] Filed: Jul. 14, 1989

[51] Int. Cl.$^5$ ............... G03F 7/027; G03F 7/028; G03F 7/032
[52] U.S. Cl. ................... 430/282; 430/281; 430/283; 430/285; 430/1; 430/907; 430/915; 430/916; 430/945; 522/2
[58] Field of Search .............. 430/281, 288, 314, 273, 430/2, 282, 907, 1; 522/2, 102, 121, 116, 120, 907

[56] References Cited

U.S. PATENT DOCUMENTS

| | | | |
|---|---|---|---|
| 3,532,406 | 10/1970 | Hartman | 350/385 |
| 3,658,526 | 4/1972 | Haugh | 430/281 |
| 4,168,982 | 9/1979 | Pazos | 430/281 |
| 4,743,531 | 5/1988 | Farid et al. | 430/286 |
| 4,772,541 | 9/1988 | Gottschalk et al. | 430/314 |
| 4,774,163 | 9/1988 | Higashi | 430/288 |

Primary Examiner—Paul R. Michl
Assistant Examiner—John S. Y. Chu

[57] ABSTRACT

Holographic photopolymer compositions having fluorinated binders are provided that produce excellent reflection holograms when holographically imaged.

75 Claims, 1 Drawing Sheet

FIG. 1

HOLOGRAPHIC PHOTOPOLYMER COMPOSITIONS AND ELEMENTS FOR REFRACTIVE INDEX IMAGING

FIELD OF THE INVENTION

This invention relates to refractive index imaging and, more particularly, to holographic compositions and elements containing a fluorinated binder that are particularly useful in refractive index imaging.

DISCUSSION OF THE BACKGROUND AND PRIOR ART

In refractive index imaging, a pattern of varying refractive indices is created within the material used to record the image. This pattern is commonly referred to as a phase hologram. When light is subsequently transmitted through, or directed onto the surface of the recording medium, the phase of the light is modulated by the pattern of refractive indices.

Early developments in the field of refractive index imaging are described in a number of basic references, including "Photography by Laser" by E. N. Leith and J. Upatnieks appearing in *Scientific American* 212, No. 6, June 1965. A useful discussion of holography is presented in "Holography" by C. C. Guest, in *Encyclopedia of Physical Science and Technology*, Vol. 6, pp. 507–519, R. A. Meyers, Ed., Academic Press, Orlando, FL, 1987. In brief, the object to be imaged is illuminated with coherent light (e.g., from a laser), and a light sensitive recording medium (e.g., a photographic plate), is positioned to receive light reflected from the object. Each point on the object reflects light to the entire recording medium, and each point on the medium receives light from the entire object. This beam of reflected light is known as the object beam. At the same time, a portion of the coherent light is directed by a mirror directly to the medium, bypassing the object. This beam is known as the reference beam. What is recorded on the recording medium is the interference pattern that results from the interaction of the reference beam and the object beam impinging on the medium. When the processed recording medium is subsequently illuminated and observed at the appropriate angle, the light from the illuminating source is diffracted by the hologram to reproduce the wave-front that originally reached the medium from the object. Thus, the hologram resembles a window through which the virtual image of the object is observed in full three-dimensional form, complete with parallax.

Holograms formed by allowing the reference and object beams to enter the recording medium from opposite sides, so that they are traveling in approximately opposite directions, are known as "reflection holograms". Interaction of the object and reference beams in the recording medium forms fringes of material with varying refractive indices which are, approximately, planes parallel to the plane of the recording medium. When the hologram is played back these fringes act as mirrors reflecting incident light back to the viewer. Hence, the hologram is viewed in reflection. Since the wavelength sensitivity of this type of hologram is very high, white light may be used for reconstruction.

Reflection holograms may be produced by an in-line or on-axis method wherein the beam of coherent radiation is projected through the recording medium onto an object therebehind. In this instance, the reflected object beam returns and intersects with the projected beam in the plane of the recording medium to form fringes substantially parallel to the plane of the medium. Reflection holograms also may be produced by an off-axis method wherein a reference beam is projected on one side of the recording medium and an object beam is projected on the reverse side of the medium. In this instance the object beam is formed by illuminating the object with coherent radiation which does not pass through the recording medium. Rather, the original beam of coherent radiation is split into two portions, one portion being projected on the medium and the other portion being projected on the object behind the medium. Reflection holograms produced by an off-axis process are disclosed in U.S. Pat. No. 3,532,406 to Hartman.

A holographic mirror is the simplest possible reflection hologram. It is the hologram of two coherent plane waves intersecting in a recording medium from substantially opposite directions. It can be created by splitting a single laser beam and recombining the beams at the recording medium, or the unsplit laser beam can be projected through the medium onto a plane mirror therebehind. A set of uniformly spaced fringes is thereby formed, with the fringes oriented parallel to the bisector of the obtuse angle between the two projected beams and having an intensity that is a $\sin^2$ function. If the obtuse angle is 180° and the projected beams are normal to the plane of the medium, the fringes will be parallel to the plane of the medium. If the obtuse angle is less than 180° or if both beams are not normal to the plane of the medium, reflective fringes will be formed which will be slanted at an acute angle relative to the plane of the medium. The holographic mirror can be characterized by its reflection efficiency (i.e., by the percent of incident radiation which is reflected), by its refractive index modulation, and by the spectral bandwidth and character of the reflected radiation.

The substantially horizontal fringes which form reflection holograms are much more difficult to record than the perpendicular fringes which form transmission holograms for two reasons. The first reason is the need for higher resolution (i.e., the need for more fringes per unit length, and thus a smaller fringe spacing). Reflection holograms, operating at a given wavelength, require about 3× to 6× more fringes per unit length than do transmission holograms at the same wavelength. The second reason is the sensitivity of horizontal fringes to shrinkage of the recording medium. Any shrinkage of the recording medium during exposure will tend to wash out the fringes and, if severe, will prevent a hologram from being formed. This is in contrast to the case with transmission holograms, where shrinkage has little or no effect if the fringes are perpendicular to the plane of the medium, and only relatively minor image distortion is produced if the transmission fringes are slanted less than 45° from perpendicular.

A variety of materials have been used to record volume holograms. Among the more important are: silver halide emulsions, hardened dichromated gelatin, photorefractives, ferroelectric crystals, photopolymers, photochromics and photodichroics. Characteristics of these materials are given in *Volume Holography and Volume Gratings*, Academic Press, New York, 1981 Chapter 10, pp. 254–304 by L. Solymar and D. J. Cook.

Dichromated gelatin is currently the material of choice for making holograms due to its high values of refractive index modulation (i.e., high diffraction efficiency, wide bandwidth response,"). However, dichromated gelatin has poor shelf life and requires wet processing after the material has been imaged to contain a hologram. Due to its poor shelf life, the material must be freshly prepared shortly before imaging or prehardened gelatin must be used, which reduces image efficiency. Wet processing introduces an additional step in preparation of the hologram, and causes dimensional changes in the material as it swells, then shrinks, during processing. These dimensional changes affect spacing of the interference fringes. Thus, it is difficult and time consuming to reproducibly make high quality holograms with dichromated gelatin.

Substantially solid, photopolymer films have heretofore been proposed for use in making holograms. U.S. Pat. No. 3,658,526 to Haugh, for instance, discloses preparation of stable, high resolution holograms from solid, photopolymerizable films by a single step process wherein a permanent refractive index image is obtained by a single exposure to a coherent light source bearing holographic information. The holographic image thus formed is not destroyed by subsequent uniform exposure to light, but rather is fixed or enhanced.

Despite the many advantages of the materials proposed by Haugh, they offer only limited viewing response to visible radiation and application has been limited to transmission holograms where the holographic image is viewed by light transmitted through the imaged material. Moreover, the materials disclosed in Haugh have little or no reflection efficiency when the material is imaged to form a reflection hologram. Thus, there continues to be a need for improved materials for use in preparing holograms in general, and reflection holograms in particular.

SUMMARY OF THE INVENTION

It now has been found that certain photopolymer compositions containing a fluorinated binder, when formed into a photosensitive element and exposed to contain a refractive index image, exhibit excellent reflection efficiencies. Refractive index modulation values higher than 0.01 are readily achieved, with typical values being higher than 0.04 with preferred compositions. Thus, the compositions are particularly suited for applications where high reflection efficiencies are particularly desired, such as holographic optical elements, optical combiners for head-up displays, notch filters, and the like. Accordingly, the present invention provides a substantially solid, transparent, photopolymerizable composition that forms a refractive-index image upon exposure to actinic radiation as the sole processing step, the composition having a refractive index modulation of at least approximately 0.01 when imaged and consisting essentially of:

(a) approximately 25 to 90% of a solvent soluble, fluorine-containing polymeric binder; approximately 5 to 60% of a liquid ethylenically unsaturated monomer, said monomer having a boiling point above 100° C. and being capable of addition polymerization; and (c) approximately 0.1 to 10% of a photoinitiator system that activates polymerization of said unsaturated monomer upon exposure to actinic radiation;

wherein said percentages are weight percentages of the total compositions.

As used herein, the term "fluorine-containing polymeric binder" refers to a binder in which fluorine is chemically bonded to, and is an integral part of, the polymeric binder. The term does not include binders wherein fluorine ions or fluorinated compounds are merely mixed with the polymeric binder.

In preferred embodiments the binder is a polymer made from vinyl acetate and a perfluorinated monomer, such as tetrafluoroethylene or hexafluoropropylene. The polymer may contain other monomers, and typically contains approximately 3 to 25% fluorine by weight. In other embodiments, the invention provides a photosensitive element comprising a substrate that supports the composition, and optical elements prepared by holographically imaging the composition to contain a refractive index image.

DETAILED DESCRIPTION OF THE INVENTION

In practicing the invention, the photosensitive composition described hereinafter is first cast or laminated to a transparent support that provides structural integrity for the composition (referred to herein as a film) as it is processed. Since the photosensitive film typically will be only 1 to 100 micrometers in thickness, the support is necessary to prevent film rupture or any stretching during processing that would affect spacing of the interference fringes created in the film that form the holographic image.

The transparent support must have sufficient optical quality that it does not unduly absorb or scatter coherent light passing through it during formation of the hologram. Also, the support generally will be sufficiently flexible that it will not separate from the film as the film is brought into contact with its permanent mounting surface, such as a curved substrate (e.g., a windshield or helmet visor). Less, if any, flexibility will be needed if the permanent mounting surface is planar, such as a sheet of glass. Exemplary transparent supports that may be selected to advantage include polyethylene terephthalate film, polymethyl methacrylate, polycarbonate, and cellulose triacetate.

Polymeric Film

The polymeric film is substantially solid, transparent, and sufficiently flexible that it can be brought into intimate contact with the surface (e.g., a windshield, helmet visor or glass sheet) to which it ultimately will be mounted. Components of the film include a binder, an ethylenically unsaturated monomer, optionally a plasticizer, and a photoinitiator system. Upon exposure to coherent light as described hereinafter, the monomer polymerizes to form higher molecular weight polymers having a different refractive index and rheological properties than unexposed area of the film. Although the film is substantially solid, components interdiffuse before, during, and after the exposure to coherent light until they are fixed by a final uniform exposure to actinic radiation or by thermal treatment at elevated temperatures. The film typically has a thickness of approximately 1 to 100 micrometers. Thinner films generally will not achieve useful reflection efficiencies.

The film reflects radiation (e.g., light) having a spectral and angular bandwidth determined by the thickness and refractive index modulation of the film. Thus, the film thickness is matched to the optical requirements of the application and the optical system, i.e., the bandwidth of light that will be used to illuminate the hologram in use (the "display source"). In general, relatively thick films will be selected for narrow bandwidth applications, and relatively thin films will be selected for broad bandwidth applications.

BINDER

The binder that is selected in accordance with the present invention is a fluorine-containing polymer that is compatible with other components of the film and, when coated, produces a substantially solid, transparent film. By "substantially solid" it is meant that the coated film, after removal of the solvent, generally has the properties of a solid material (e.g., dimensional stability).

Presence of fluorine in the binder generally reduces the refractive index of the polymer, thereby increasing refractive index modulation values achieved in the film after imaging to contain a hologram. Refractive index modulation increases with increasing fluorine content; however, the presence of fluorine should be limited to that which does not cause the film to become opaque. Accordingly, fluorine contents within the range of approximately 3 to 25% typically will be selected, although the advantages will be achieved at lower levels, such as 1%. The amount of fluorine present can be adjusted to achieve the refractive index modulation desired for a specific application.

Fluorine is conveniently introduced by copolymerizing a fluorine-containing monomer with other monomers that constitute the binder, or may be introduced by reaction with the binder. For example, condensation, acetalization, ketalization, or esterification reactions may be used to introduce fluorine when the binder contains appropriate alcohol or acid substituent groups.

Binders that may be selected include polymers of a fluorinated monomer with a vinyl ester, vinyl alcohol, vinyl ether, vinyl acetal/butyral, or interpolymers or mixtures thereof. For example, the binder may be a polymer of a fluorinated monomer with vinyl acetate. If desired, the acetate substituents of this polymer can be removed by hydrolysis to obtain the fluorinated poly(vinyl alcohol) derivative. The fluorinated poly(vinyl alcohol) can, in turn, be condensed with, for example, butyraldehyde, to form a fluorinated poly(vinyl butyral) derivative. Fluorinated derivatives of poly(vinyl formal), poly(vinyl acetal), etc., as well as mixtures thereof, can be prepared in an analogous manner. The fluorinated monomer is conveniently a perfluorinated monomer, such as tetrafluoroethylene and/or hexafluoropropylene, but other monomers, such as vinyl fluoride or vinylidene fluoride, may be selected for specific applications. Other monomers may also be present if desired. For example, ethyl vinyl ether may be included in the monomer mixture to modify chemical and mechanical properties of the film, such as solubility, compatibility, adhesion, flexibility, or hardness of the holographic film. Such polymers are conveniently prepared using conventional free radical polymerization techniques.

Fluorinated binders may also be prepared by the reaction of fluorinated compounds with appropriately substituted polymers. Polymers containing potentially reactive sites, such as, hydroxyl or carboxyl groups, can be converted to fluorinated binders by reaction with fluorinated compounds. Fluorinated poly(vinyl butyral), for example, may be prepared by condensation of poly(vinyl alcohol) with 2,2,3,3,4,4,4-heptafluorobutyraldehyde. Carboxylic acid containing polymers can be esterified with fluorinated alcohols; hydroxyl containing polymers, such as poly(vinyl alcohol), partially hydrolyzed poly(vinyl acetate), or hydrolyzed or partially hydrolyzed polymers of vinyl acetate with fluorinated monomers, can be esterified with fluorinated carboxylic acids. Fluoroolefins may be grafted onto appropriately substituted polymers using standard grafting techniques.

Polymers of a vinyl ester, at least one fluorinated monomer, and optionally other monomer(s) to modify mechanical properties of the resulting film, are preferred. In general, binders will be selected that contain at least approximately 3% fluorine, by weight, since the advantages of the invention diminish as fluorine content is reduced. If the fluorine content becomes too high, however, the resulting film tends to become opaque and not useful for the preparation of holographic elements. Preferred binders typically will have a fluorine content of approximately 3 to 25%, by weight.

Vinyl acetate is conveniently selected as the vinyl ester component of the binder, and is particularly preferred. Other vinyl esters and structurally related compounds that yield similar results also may be selected in addition to, or in lieu of, vinyl acetate. For example, vinyl pivalate, vinyl propionate, vinyl stearate, vinyl alcohol, ethyl vinyl ether, or n-butyl vinyl ether may be selected. Perfluorinated monomers, such as tetrafluoroethylene and/or hexafluoropropylene, have been found to be particularly useful as the fluorinated monomer component, but other compounds, such as vinyl fluoride, vinylidene fluoride, fluoroolefins, fluoroalkyl acrylates and methacrylates, may be selected for specific applications.

Selection of the fluorinated binders, rather than the nonfluorinated counterpart, has been found to dramatically increase the refractive index modulation, and hence efficiency of holographic elements. For example, refractive index modulation values in excess of 0.040, and as high as 0.076, have been achieved using vinyl acetate/perfluorinated-monomer polymers, in contrast to values in the range of approximately 0.025 to 0.031 achieved with polyvinylacetate, all other components of the composition being the same.

Fluorinated binders provided by the invention can be selected for only a portion of the total binder if so desired. In this case, nonfluorinated counterparts of the above-described binders may be selected as the other component, provided that the two binders are compatible with each other and the coating solvent and with the other film components, and that there is no undue sacrifice to film clarity, mechanical properties, etc.

MONOMERS

The film contains at least one ethylenically unsaturated monomer that is capable of free radical initiated addition polymerization, has a boiling point above 100° C., and is compatible with the coating solvent and selected binder. The monomer usually will contain the unsaturated group in the terminal position. A liquid monomer will generally be selected, but solid monomers can be used to advantage, generally in combination with one or more liquid monomers, provided the solid monomer is capable of interdiffusion in the substantially solid film composition.

A preferred class of monomers for use in the compositions of this invention are liquid, ethylenically unsaturated compounds capable of addition polymerization and having a boiling point above 100° C., which contain one or more moieties taken from the group consisting of a substituted or unsubstituted phenyl, biphenyl, phenoxy, naphthyl, naphthyloxy, and heteroaromatic groups containing up to three aromatic rings; chlorine; and bromine. The monomer contains at least one such moiety and may contain two or more of the same or different moieties of the group, provided the monomer remains liquid. Substituted groups, such as lower alkyl, alkyoxy, hydroxy, phenyl, phenoxy, carboxy, carbonyl, amino, amido, imido, cyano, chloro, bromo or combinations thereof, may be present provided that the monomer remains liquid and diffusable in the photopolymerizable layer. Representative liquid monomers include: 2-phenoxyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, 2-(1-naphthyloxy)ethyl acrylate, o-biphenyl methacrylate, o-biphenyl acrylate, and mixtures thereof.

While most monomers useful in this invention are liquids, they may be used in admixture with one or more ethylenically unsaturated solid monomers such as the ethylenically unsaturated carbazole monomers disclosed in H. Kamogawa, et al., *Journal of Polymer Science: Polymer Chemistry Edition*, Vol. 18 (1979), pp 9–18; 2-naphthyl acrylate; pentachlorophenyl acrylate; 2,4,6-tribromophenyl acrylate; 2-(2-naphthyloxy)ethyl acrylate; N-phenyl maleimide; p-biphenyl methacrylate; 2-vinylnaphthalene; 2-naphthyl methacrylate; N-phenyl methacrylamide; and t-butylphenyl methacrylate.

Ethylenically unsaturated carbazole monomers containing a vinyl group attached to the nitrogen atom of the carbazole moiety typically are solids. Suitable monomers of this type include N-vinyl carbazole and 3,6-dibromo-9-vinyl carbazole. A particularly preferred mixture of ethylenically unsaturated monomers comprises N-vinyl carbazole in combination with one or more of the above liquid monomers, in particular, with 2-phenoxyethyl acrylate, phenol ethoxylate monoacrylate, ethoxylated bisphenol A diacrylate, or mixtures thereof.

If crosslinking of the photopolymer is desired, up to about five weight percent of at least one multifunctional monomer containing two or more terminal ethylenically unsaturated groups may be incorporated into the composition. The polyfunctional monomer must be compatible with the other components of the composition and is preferably a liquid. Suitable multifunctional monomers include di-(2-acryloxyethyl)ether of bisphenol A, ethoxylated bisphenol A diacrylate, triethylene glycol diacrylate, trimethylol propane triacrylate, and the like. A preferred crosslinking for use in the compositions of this invention is ethoxylated bisphenol A diacrylate.

Photoinitiator System

The initiator system comprises one or more compounds which directly furnish free-radicals when activated actinic radiation. By "actinic radiation" is meant radiation which is active to produce the free-radicals necessary to initiate polymerization of the monomeric material. It can also comprise a plurality of compounds, one of which yields the free-radicals after having been caused to do so by another compound, or sensitizer, which is activated by the radiation. Photoinitiator systems useful in practicing this invention typically will contain a photoinitiator and a sensitizer which extends the spectral response into the near ultraviolet, the visible, and/or near infrared spectral regions.

A large number of free-radical generating compounds can be utilized in the practice of this invention. Redox systems, especially those involving dyes, e.g., Rose Bengal/2-dibutylaminoethanol, may be used. Photoreducible dyes and reducing agents, as well as dyes of the phenazine, oxazine, and quinone classes; ketones; quinones; dye-borate complexes as disclosed in U.S. Pat. No. 4,772,541; dye sensitized azinium salts as disclosed in U.S. Pat. No. 4,743,531; and trichloromethyl triazines as disclosed in U.S. Pat. Nos. 4,772,534; 4,774,163; and 4,810,618 can be used to initiate photopolymerization. A useful discussion of dye sensitized photopolymerization can be found in "Dye Sensitized Photopolymerization" by D. F. Eaton in *Adv. in Photochemistry*, Vol. 13, D. H. Volman, G. S. Hammond, and K. Gollinick, eds., Wiley-Interscience, New York, 1986, pp. 427–487.

Preferred initiator systems are 2,4,5-triphenylimidazolyl dimers with chain transfer agents, or hydrogen donors, and mixtures thereof, sensitized by visible sensitizers. Preferred 2,4,5-triphenylimidazolyl dimers include CDM-HABI, i.e., 2-(o-chlorophenyl)-4,5-bis(m-methoxyphenyl)-imidazole dimer; o-Cl-HABI, i.e., 1,1'-biimidazole, 2,2'-bis (o-chlorophenyl)-4,4'5,5'- tetraphenyl-; and TCTM-HABI, i.e., 1-imidazole, 2,5-bis(o- chlorophenyl)-4-[3,4-dimethoxyphenyl]-, dimer, each of which is typically used with a hydrogen donor.

A preferred group of sensitizers include the bis(p-dialkylaminobenzylidine) ketones disclosed in Baum and Henry, U.S. Pat. No. 3,652,275 and the arylyidene aryl ketones disclosed in Dueber, U.S. Pat. No. 4,162,162. Particularly preferred sensitizers include the following: DEAW, i.e., cyclopentanone, 2,5-bis[4-(diethylamino)phenyl]-methylene]-; and JAW, i.e., cyclopentanone, 2,5-bis[(2,3,6,7-tetrahydro-1H,5H-benzo[i,j]quinolizin-1-yl)methylene]-. Other particularly useful sensitizers are cyclopentanone, 2,5-bis[2-(1,3-dihydro-1,3,3-trimethyl-2H-indol-2-ylidene)ethylidene], CAS 27713-85-5; and cyclopentanone, 2,5-bis-[2-ethylnaphtho[1,2-d]thiazol-2(1H)-ylidene)ethylidene], CAS 27714-25-6.

Suitable hydrogen donors include: 2-mercaptobenzoxazole, 2-mercaptobenzothiazole, 4-methyl-4H-1,2,4-triazole-3-thiol, and the like. Other suitable hydrogen donor compounds, which are preferred for compositions which contain N-vinyl carbazole monomer, are 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; 1-dodecanethiol; and mixtures thereof.

Other Components

Other components conventionally added to photopolymer compositions can be present to modify the physical properties of the film. Such components include: plasticizers, thermal stabilizers, optical brighteners, ultraviolet radiation stabilizers, adhesion modifiers, coating aids, and release agents.

A plasticizer may be present to modify adhesion, flexibility, hardness, and other mechanical properties of the film in a conventional fashion. Candidate plasticizers include triethylene glycol dicaprylate, triethylene glycol bis(2-ethylhexanoate), tetraethylene glycol diheptanoate, diethyl sebacate, dibutyl suberate, tris(2-ethylhexyl) phosphate, Brij® 30 [$C_{12}H_{25}(OCH_2CH_2)_4OH$], and Brij® 35 [$C_{12}H_{25}(OCH_2CH_2))_{20}OH$]. Other plasticizers that yield equivalent results will be apparent to those skilled in the art. It will also be appreciated that a mixture of plasticizer and solid monomer may be used, provided that the mixture of plasticizer and monomer remains liquid.

A thermal polymerization inhibitor normally will be present to improve the storage stability of the composition. Useful thermal stabilizers include: hydroquinone, phenidone, p-methoxyphenol, alkyl and aryl-substituted hydroquinones and quinones, t-butyl catechol, pyrogallol, beta-naphthol, 2,6-di-t-butyl-p-cresol, phenothiazine, and chloranil. The dinitroso dimers described in Pazos, U.S. Pat. No. 4,168,982, are also useful. Since monomers usually contain thermal polymerization inhibitors added by their manufacturers, it may not be necessary to add additional inhibitor.

Nonionic surfactants may be added to the photopolymerizable composition as coating aids. Preferred coating aids are fluorinated nonionic surfactants, such as Fluorad ® FC-430 and Fluorad ® FC-431.

Useful optical brighteners include those disclosed in Held, U.S. Pat. 3,854,950. An representative optical brightener is 7-(4'-chloro-6'-diethylamino-1',3',5'-triazine-4'-yl) amino 3-phenyl coumarin. Ultraviolet radiation absorbing materials useful in the invention are also disclosed in Held, U.S. Pat. No. 3,854,950.

FILM COMPOSITION

Proportions of ingredients in the photopolymer composition generally will be within the following percentage ranges, based on total weight of the composition: binder, 25 to 90%, preferably 45 to 75%; monomer, 5 to 60%, preferably 15 to 50%; plasticizer, 0 to 25%, preferably 0 to 15%; photoinitiator system, 0.1 to 10%, preferably 1 to 7%; and optional ingredients, 0 to 5%, typically 1 to 4%. If the amount of binder is below approximately 25%, or the amount of monomer exceeds approximately 60%, the composition has insufficient viscosity to form a solid film. The presence of binder is held within approximately 90% since performance is unduly lost at higher levels of addition, and resulting films have diminished values of refractive index modulation. Likewise, levels of monomer used will be at least approximately 5% since lower quantities will not produce films having practical values of refractive index modulation.

The composition may be directly coated onto the transparent support described hereinbefore, or may be cast as a film that is then laminated to the transparent support by conventional methods. In either case the transparent support generally provides only temporary dimensional stability for the photopolymer film prior to mounting on its permanent substrate, and thus the support is releasable from the film. For some applications, however, it may be desired to retain the support as a permanent overcoat or protective layer for the photopolymer film, in which case the support and photopolymer film may be permanently bonded. The other side of the supported photopolymer film may have a temporary protective cover sheet, such as a polyethylene or polypropylene film, releasably adhered thereto. Conventional intermediate layers or coatings may be used to facilitate the adhesive and/or release characteristics desired for a particular application.

EXPOSURE OF THE FILMS

Figure 1:
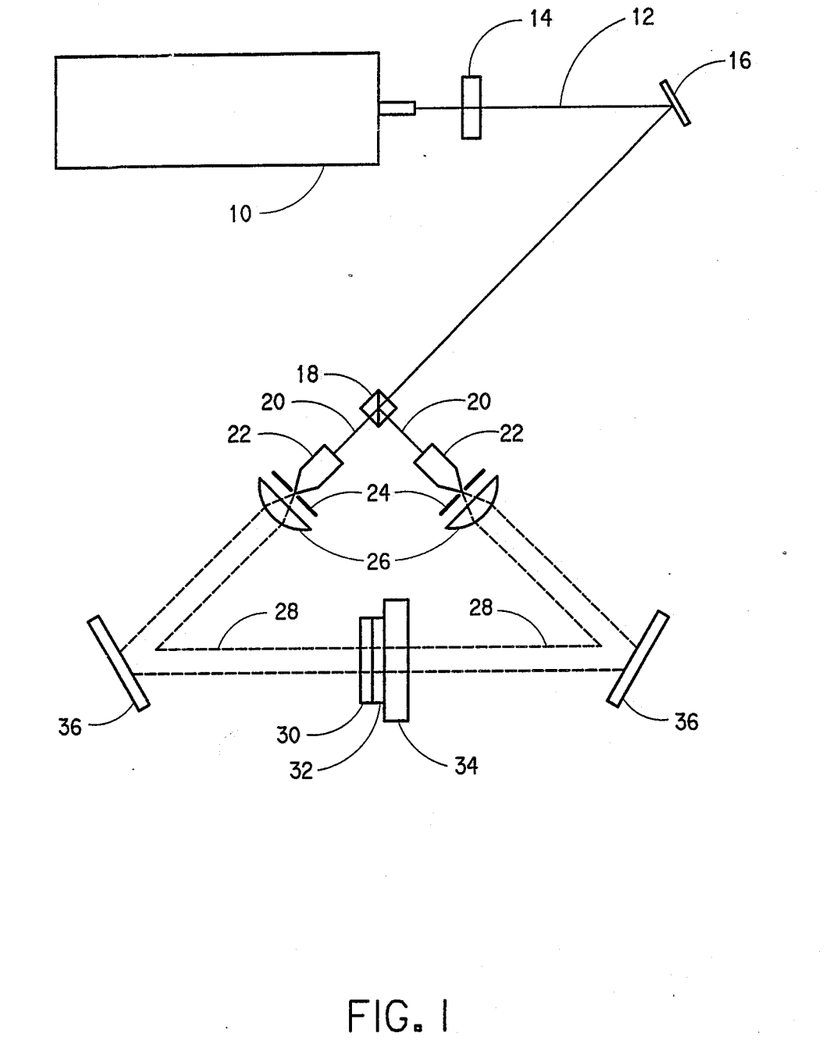
FIG. 1 illustrates an off-axis method of forming reflection holograms.

Referring to FIG. 1, a reflection hologram is formed, using the "off-axis" technique, by exposing the film to the intersection of two counter-propagating laser beams. The laser (10) produces a laser beam (12) which is controlled by a shutter (14). The laser beam (12) is directed by a mirror (16) into a beam splitter (18) wherein the beam is divided into two equal beam segments (20). Each beam segment (20) passes through a microscope objective (22), pinhole (spacial filter) (24), and collimating lens (26) to produce an expanded, collimated beam (28). Each expanded, collimated beam (28) is reflected by a mirror (36) to converge in the photopolymerizable layer (32). In graphic arts applications, the object being recreated in the hologram takes the place of the mirror in the path of one of the beams in conventional fashion. The photopolymerizable layer (32) is mounted on a glass plate (34) and protected by a polyethylene terephthalate film support (30).

Interference fringes are created within the photopolymerizable layer by directing the two beams into the layer. In the embodiment shown in FIG. 1, this is achieved by tilting the glass plate to an angle of 5° to 70° from the line perpendicular to the axis of the two beams. The interference fringes thereby created in the photopolymer are slanted (i.e., the fringes are at an angle to the film plane). The fringes reflect light having a wavelength similar to that used to form the fringes, and impacting the film at the same angle that was used to form the fringes.

Alternatively, one may use an "on-axis" technique for imaging the film. In this case a coherent beam of light, such as a collimated 488 nm argon-ion laser beam, is projected onto one surface of the film, typically at an angle up to 70° from the normal to the film plane. The collimated beam in part functions as a "reference beam", while a portion is transmitted through the layer and reflected back by a mirror mounted behind the film, thereby functioning as an "object beam". Intersection of the reference beam and object beam, in the film, forms interference fringes that are oriented substantially parallel to the film plane. These fringes form a reflection hologram, which functions as a mirror, when viewed with light projected on the front surface of the film. A potential difficulty with the "on-axis" mode of operation may occur if the film and its support absorb a substantial portion of the beam used to image the film, in which case the reflected object beam may be too weak to form a satisfactory hologram. If this should occur, however, the film formulation is readily adjusted to minimize the problem.

It may be advantageous to preheat the film, and then image the film while it still is at an elevated temperature. In this embodiment the film is heated to a moderate temperature, typically in the range of approximately 30° to 50° C., and then exposed to the coherent light source while the film is still warm. Preheating has been found to improve reflection efficiency of the imaged film and to increase photospeed. Thus, preheating permits use of a lower energy laser and/or allows the imaging step to be completed more quickly.

After the holographic mirror has been formed by either of these techniques, the image is fixed by flooding the film with actinic radiation. This may be achieved by exposing the film to normal room light, but it is preferred to flood the surface with higher intensity light, ultraviolet light, or a combination thereof, to complete polymerization of the monomer component of the film.

The reflection holographic mirrors described above have improved reflection efficiency compared to prior art photopolymer compositions of Haugh. Whereas the Haugh formulations typically will have a reflection efficiency less than 10%, reflection efficiencies in the range of approximately 15% to over 60% are achieved in accordance with the invention. The reflection efficiencies are even further improved if the imaged film is either further treated with a particular class of liquids that process the hologram, or is heated, as described hereinafter. These enhancement techniques will increase the reflection efficiency, generally two {21 or three fold, to above 70%, to as high as 99+%, with no apparent detrimental effects. Concurrently, the holographic mirror can reflect light over a broader bandwidth.

LIQUID ENHANCEMENT

The class of liquids that are particularly effective in enhancing reflection holograms are organic liquids which swell the hologram, e.g., alcohols, ketones, esters, glycol alkyl esters, etc. Use of one or more such enhancing agents is generally all that is required to effect image enhancement. The enhancing agent may be a single liquid or a mixture of such liquids of varying activity. Diluents, e.g., water, hydrocarbon solvents, can be present to decrease the concentration of the enhancing agent. Diluents are "inert solvents" which, when they are applied alone to the hologram surface, have substantially no effect on reflection efficiency. Diluted enhancing agents are used in the instance when limited equilibrated enhancement is desired at lower than maximum reflectance, or when use of the enhancing agent alone causes some dissolving of the hologram. Additional treatment of such limited equilibrated enhancement is possible with a more concentrated or more active enhancing agent.

Enhancing agent typically is applied after the reflection hologram has been fixed by uniform actinic exposure. The reflection hologram may be immersed in the enhancing agent or may be applied by other means. The procedure for applying the enhancing agent to the imaged holographic recording medium generally is controlled to obtain a uniform enhancement of the reflection hologram and to prevent damage to the polymeric image, which is softened by the swelling action of the enhancing agent. Ideally, just sufficient enhancing agent is needed to uniformly wet the image surface without either flooding it or applying tangential or compressive forces. However, since the rate of enhancement of the diluted agents of this invention is slower and can be repeated, uniformity can be insured by multiple applications. Any method may be used to uniformly apply the enhancing agent to the hologram provided the method does not entail abrasive or compressive forces which would distort or mar the image.

A satisfactory method of applying the enhancing agent is by lightly drawing across the image area the edge of a paint brush or other applicator such as a foraminous wick, soaked in enhancing agent. If the image area is small this procedure might be accomplished with a small brush or a felt-tip pen. If the image area is large, a felt-edge squeegee of sufficient length might be used. In either case the enhancing agent is supplied uniformly from the applicator to the hologram and is absorbed into the hologram to increase its reflection efficiency. In place of felt, any foraminous material may be used such as paper, and woven and nonwoven fabrics. Similarly, the enhancing agent may be applied as a mist, e.g., using an airbrush; or carefully coated as a liquid film. Excess enhancing agent that may be present is removed from this hologram by known means. Normal evaporation or speeded evaporation by air impingement using air at ambient temperature or elevated temperature are useful in removing excess enhancing agent. The enhancing agent may also be removed by treating with diluent nonenhancing agent.

Enhancing agents useful in this invention include: glycol alkyl ethers, e.g., 2-methoxyethanol, 2-ethoxyethanol and 2-butoxyethanol; alcohols, e.g., methanol, ethanol, butanol, 1- or 2-propanol; ketones, e.g., acetone, methyl ethyl ketone, cyclohexanone, etc.; esters, e.g., ethyl acetate, etc.; as well as other enhancing agents.

Diluents that may be present with the aforementioned enhancing agent include: water; inert hydrocarbon solvent, e.g., a mixture of $C_{8-10}$ iso-paraffins with a boiling point range of 116°-149° C.; hexane; cyclohexane; heptane; 1,2-dichloroethane; trichlorotrifluoroethane; and the like.

Typically, maximum enhancement of the entire film is desired, requiring full strength treatment of the film by a highly active agent for a duration to reach in increased equilibrated reflection efficiency. Surprisingly, the reflection efficiency remains at the equilibrated value even after the agent has been substantially removed. In those instances where immersion is not used or where isolated areas of the film are to be enhanced, controlled methods of application identified above may be used to prevent flooding of the hologram surface and retain the agent in the desired isolated area.

It has been found that liquid enhancement works best with films that have not been Thermally Enhanced (described below). Liquid enhancement increases refractive index modulation and shifts playback wavelength to a higher value. It also has been found that the shift in playback wavelength achieved by liquid enhancement tends to be reversible to the extent that the liquid may subsequently evaporate from the film. Accordingly, it may be desired to select liquids that will remain in the film, once absorbed, or to provide an impervious cover layer over the treated film.

THERMAL ENHANCEMENT

Holograms formed using the unique films of this invention may be thermally treated to enhance diffraction and reflection efficiency. In this embodiment, a reflection holographic mirror is first formed in the film as described above. The film is then heated to a temperature above 50° C., and preferably between 80° and 160° C., for a commensurate time period to maximize enhancement. Two to three fold improvements in refractive index modulation are readily achieved. Thermal enhancement treatment may be carried out either before or after the image is fixed by flooding the film with actinic radiation as described above, but typically it is carried out after the fixing step. The thermal treatment may concurrently fix the enhanced hologram by thermally hardening or polymerizing the photopolymerizable material in the hologram. Both the rate of thermal enhancement and the rate of thermal hardening increase with increasing temperature, with most of the benefits being achieved during early stages. For example, when using a 100° C. enhancement temperature most of the enhancement occurs during the first 5 to 10 minutes, with little further improvement occurring after one hour.

In the practice of this embodiment of the invention, the reflection hologram is heated by any conventional method. For example, the film may be heated in a simple convection oven, irradiated with infrared or microwave radiation, or contact heated on a hot shoe or in a lamination press. Whichever means is used, care is needed to prevent distortion or damage to the photopolymer layer containing the reflection hologram.

Thermal enhancement is particularly useful in the preparation of Head-Up Displays for use in windshields and other glass laminate structures. Since these structures are curved, it generally is more convenient to image the film to contain the holographic mirror prior to lamination to the glass, rather than after lamination, to simplify the optics needed to image the film. Thus, sufficient heat may be applied during lamination to thermally enhance the holographic mirror.

TREATMENT WITH LIQUID MONOMER

It also has been found that optical properties of the hologram, such as diffraction and reflection efficiency, tend to be stabilized against degradation over time if the film is treated with a solution containing liquid monomer after the reflection hologram has been formed. In this treatment the film surface is exposed to the liquid monomer solution by immersion, spraying, or similar techniques to allow the monomer to be absorbed into the film. The monomer may be the same monomer contained in the film composition, or a different liquid monomer. The film is then dried, and the absorbed monomer is polymerized by exposing the film to actinic radiation such as ultraviolet or visible light. This treatment not only has a stabilizing effect on the optical properties, but also affects the spacing between interference fringe planes, thereby causing the holographic mirror to reflect a longer wavelength of light. Reflection efficiency also may be affected. Thus, through the selection of particular liquid monomers, carrying solvent, and soak time before polymerization it is possible to permanently modify the optical properties of the film.

SHIFT IN WAVELENGTH OF RESPONSE

If desired, the film may contain a relatively volatile agent during the imaging step, which is subsequently removed after imaging. In this embodiment the spacing between the fringes of the holographic mirror is reduced when the agent is removed, causing the film to reflect shorter wavelength radiation than was used to form the mirror. This effect can be achieved by the selection of solvents or plasticizers that are compatible with the selected film composition, and which can be removed by evaporation or during heat processing of the film.

The wavelength of response may be shifted by diffusing a nonvolatile plasticizer or monomer into the imaged and processed hologram. The is conveniently carried out by laminating a diffusion element containing binder and monomer and/or plasticizer to the film containing the imaged and processed hologram and allowing diffusion to take place. The diffusion element may be a piece of unexposed film or it may contain monomers and/or plasticizers. The laminated film and diffusion element may be heated during diffusion or diffusion may be carried out at room temperature. To stop diffusion, the diffusion element may be removed after diffusion or, if it is desired that diffusion go to equilibrium, it may be left in place. If the diffusion element contains a monomer, diffusion may be stopped by heating the laminate and/or exposed it to actinic radiation.

EVALUATION OF CANDIDATE FILMS

To evaluate candidate films, holographic mirrors are prepared and values determined for reflection efficiency at the wavelength of maximum reflection. Refractive index modulation (M) is then calculated from the reflection efficiency and film thickness.

Film elements are prepared comprising, in order: a 0.1 mm clear polyethylene terephthalate film support; a dried layer of the candidate photopolymerizable film composition having a thickness of 15 to 35 micrometers; and a 0.023 mm polyethylene terephthalate cover sheet. The film elements are cut into uniform sections, the cover sheet is removed, and the element is hand laminated by contacting the tacky photopolymerizable film composition directly to either a glass plate or the glass back of an aluminum front-surface mirror. The film support is typically left in place to protect the photopolymerizable film composition during exposure and handling operations.

Holographic mirrors are formed in the candidate film compositions mounted on front-surface mirrors, using the "on-axis" technique previously described, by exposure to a collimated laser beam oriented perpendicular to the film plane and reflecting back on itself. Conveniently, the laser beam is the $TEM_{oo}$ mode of an argon laser at 488 or 514 nm, or at a krypton laser at 647 nm. Coatings mounted on glass plates are generally processed the same as those mounted on the front-surface mirror. After exposure to record the holographic mirror, the film element is overall exposed to ultraviolet and visible light. The film element is then removed from the mirror and transmission spectra is recorded at 400–700 nm using a conventional spectrophotometer. If the film is laminated to a glass or plastic substrate, the processing and measuring steps can be performed without removing the film from the substrate. The intensity of light transmitted through the film at the wavelength of maximum reflection ($I_{trans}$), is measured as well as the intensity of light transmitted through the film in areas where there is no holographic Image ($I_o$). Maximum reflection efficiency ($\eta$), is calculated from the formula:

$$\eta = [1-(I_{trans}/I_o)].$$

Also, the intensity of reflected light is plotted versus wavelength of the light, and the bandwidth is measured at which 50% or more of the reflected light is reflected (i.e., full bandwidth at one-half max., fwhm). The holographic mirror is then heated to 80° to 150° C. for 30 to 60 minutes in a convection oven, cooled to room temperature, and analyzed again by recording and measuring their transmission spectra.

Refractive index modulation of the holographic mirror is calculated from the maximum reflection efficiency ($\eta$) using Kogelnik's coupled wave theory (H. Kogelnik, Bell Syst. Tech. J., 48, 2909–2947, 1969), which for an unslanted holographic mirror in which the incident radiation is perpendicular to the plane of the mirror, is represented by the formula:

$$\eta = \tanh^2\left[\frac{\pi M d}{\lambda}\right]$$

where
$\eta$ = the maximum reflection efficiency;
M = refraction index modulation;

λ = probe radiation wavelength in free space; and
d = mirror (i.e., film) thickness.

Solving this equation for M, refractive index modulation is calculated as:

$$M = \left[\frac{\lambda \tanh^{-1}\sqrt{\eta}}{\pi d}\right]$$

Refractive index modulation represents the magnitude of differences in refractive index within the film after it has been imaged to contain the reflection hologram. It is not thickness dependent, but describes the inherent capability of the film composition to record a refractive index change, i.e., reflection hologram. Films having higher refractive index modulations will have higher reflection efficiencies and bandwidths at the same thickness.

Useful film compositions that may be selected in practicing the invention typically have a refractive index modulation of at least 0.040, and generally will be at least 0.050 after enhancement in order to achieve high reflection efficiencies while minimizing the film thickness. With these films reflection efficiencies in the order of 70% to 99%, are readily achieved at film thickness of 10 to 100 micrometers that are particularly useful in the fabrication of Head-Up Displays, notch filters, and the like. In contrast, prior art photopolymer compositions that have been proposed by Haugh for holographic applications typically will have a refractive index modulation of 0.001 or less, and holographic mirrors produced from the photopolymer compositions typically have a reflection efficiency no higher than 10% at comparable thicknesses.

Applications

The compositions and photosensitive elements of this invention are used in a variety of applications. Holograms can be used in displays as, for example, in advertising or packaging; in security applications as, for example, on credit cards, bank notes, lottery tickets, and the like; and for information storage.

Holographic Optical Elements (HOE's)

The compositions may be used to make holographic optical elements (HOE's). HOE's may replace lenses, gratings, mirrors, and more complex optical elements in optical systems. HOE's have certain advantages over conventional optical elements: (1) they can be produced by a photographic process making them potentially low cost in mass production, (2) the optical configuration is independent of the substrate configuration, (3) they can be spectrally sensitive, performing as narrow band rejection filters, and (4) the weight and space occupied by a HOE can be insignificant in comparison to that of conventional optics. Important application of HOE's include: fiber optic couplers, scanners, holographic notch filters and head-up displays.

Head-Up Displays

Head-up displays (HUDs) are used to display information on the windshield of a vehicle, such as an aircraft or automobile, in order that the person controlling the vehicle has ready access to the information without the need to divert attention to an instrument panel. The desired information is optically projected onto the windshield, where it is reflected into the operator's line of sight. In other applications, the information may be projected onto a transparent screen between the operator and the windshield, or onto a visor worn by the operator (e.g., the pilot of an aircraft), and then reflected to the operator. Thus, the operator has immediate access to the information while continuing to view the path of the vehicle.

The element used to reflect the information to the operator is commonly referred to as "optical combiner", or, more simply, as a "combiner". To be effective, the combiner must have several properties. It must selectively reflect only a narrow band of light and be transparent to other wavelengths. Thus, information projected onto the windshield, screen, or visor, will be reflected to the operator while other wavelengths will pass through the combiner, enabling the operator to simultaneously view both the projected information and the path of the vehicle. Secondly, it is desirable for the combiner to have a high reflection efficiency for the light band used to display information in order that the information can be easily observed. Combiners having a reflection efficiency of at least 15% for the light band used to display information are particularly useful.

To produce a head-up display the film is mounted on a glass. In general, the film will be mounted on the glass after it has been exposed and processed although, in some cases it may be desirable to coat or laminate the film directly onto the glass and expose and process the film on the glass. Alternatively, the film may be exposed on the support, transferred to the substrate, and processed. The exposed film, processed or unprocessed, may be pressure laminated to glass or may be attached with a transparent optical adhesive. If the unprocessed film is laminated to glass with heat, the lamination and thermal processing steps may be carried out at the same time. After removal of the temporary support, the laminated glass sheet may be used as an optical combiner in a head-up display. For many applications, however, the laminated glass sheet (after removal of the temporary support) is then placed in a lamination press along with a second glass sheet, with a plasticized polyvinyl butyral polymer sheet therebetween, so that the photopolymer film is in face to face contact with the interleaf. Heat and pressure are applied to the glass-sandwich structure (e.g., about 130° to 150° C.) whereby the reflection hologram is enhanced and fixed concurrently with forming a glass laminate. Surprisingly, a safety glass laminate is thereby formed that contains a holographic mirror substantially free of distortion. The safety glass laminate can be used as the optical combiner in a "head-up" display. While glass typically is used in such displays, other transparent sheet material may also be used for other applications, such as quartz, polymethyl methacrylate, polycarbonate, polystyrene, and the like, provided that the selected thermal treatment conditions do not destroy the material.

Holographic Notch Filters

Holographic notch filters provide protection against laser radiation for eyes and for sensors and other optical instruments in both military and nonmilitary situations. To be effective these protective filters must have a high optical density at the selected wavelength, a narrow spectral bandwidth, maximum transmission outside the selected band, and excellent optical properties. The absorption maximum of the filter should closely correspond to the wavelength to be rejected. Strong absorption of a narrow, selected portion of the spectrum allows protection from discrete laser lines yet allows for good visibility since the rest of the spectrum passes through the filter. In many situations it is also necessary for the filter to provide protection against several wavelengths. While the optical density required for an effective holographic notch filter varies with the application, the power of the radiation source, and the wavelength to be rejected, holographic notch filters having an optical density of about 2 (99% rejection), and preferably at least 3 (99.9% rejection) at the wavelength to be rejected are particularly useful.

In addition to the optical requirements, a rugged environmentally stable technology is required. The filter must not change its optical properties under a wide variety of environmental conditions. It is also desirable for the filter to be compatible with a variety of different substrates including different glasses and plastics such as polycarbonate.

To produce a holographic notch filter the film is mounted on a permanent substrate. In general, the film will be mounted on the substrate after it has been exposed and processed although, in some cases it may be desirable to coat or laminate the film directly onto the permanent substrate and expose and process the film on the substrate. Alternatively, the film may be exposed on the support, transferred to the substrate, and processed. The exposed film, processed or unprocessed, may be pressure laminated to the substrate or may be attached with a transparent optical adhesive. If the unprocessed film is laminated to the substrate with heat, the lamination and thermal processing steps may be carried out at the same time.

The substrate must be dimensionally stable and transparent to visible radiation in the case of glasses for eye protection or to the wavelength region which the instrument is designed to detect in the case of sensors and other optical instruments. In addition it must be environmentally stable, compatible with the film, and stable to the selected thermal conditions used to process the film. Useful substrates are glass, quartz, polymethyl methacrylate, polycarbonate, and polystyrene. Polycarbonate is the preferred substrate for military applications because it is light weight and also offers ballistic protection.

For applications, in which protection from more than one laser wavelength is desired, one or more additional films, each of which has been imaged to reject a different wavelength, may be laminated to the initial film-substrate laminate. In general, it will be more convenient to laminate the additional films on top of the initial film, but a second film could be laminated to the substrate as well. If an extremely high optical density is desired, additional films which have been imaged to reject the same wavelength as the initial film may be laminated to the film-substrate laminate. The films may be pressure laminated together or may be attached with a transparent optical adhesive.

Optionally, the film may be covered with a protective coating to protect it from damage, such as scratches. The protective material must be transparent, scratch resistant, and compatible with the film. Glass and plastics may be used as protective coatings. It may be laminated to the film or attached with a transparent optical adhesive.

The holographic notch filter only reflects (i.e., rejects) radiation having a narrow bandwidth that is determined by the wavelength of coherent radiation that was used to image the film, the imaging geometry, and the subsequent processing of the film. Thus, most of the broad spectrum of radiation in front of the filter passes through the filter to the view or to the sensor or other optical instrument even though the filter is mounted in the field of vision.

EXAMPLES

The invention will now be further illustrated by reference to the following examples, in which copolymer compositions are given as percent by weight.

| GLOSSARY | |
|---|---|
| AIBN | 2,2'-Azobisisobutyronitrile; CAS 78-67-1 |
| FC-430 | Fluorad ® FC-430, liquid nonionic surfactant; fluoroaliphatic polymeric esters; CAS 11114-17-3; 3M Company |
| FC-431 | Fluorad ® FC-431, liquid nonionic surfactant; 50% solution of fluoroaliphatic polymeric esters in ethyl acetate; 3M Company |
| HFP | Hexafluoropropylene |
| JAW | Cyclopentanone, 2,5-bis[(2,3,6,7-tetrahydro-1H,5H-benzo[i,j]quinolizin-1-yl)methylene]- |
| Kynar ® 301 F | Poly(vinylidene fluoride); Pennwalt Corp. |
| MMT | 4-Methyl-4H-1,2,4-triazole-3-thiol; CAS 24854-43-1 |
| NVC | N-Vinyl carbazole; 9-vinyl carbazole; CAS 1484-13-5 |
| o-Cl-HABI | 1,1'-Biimidazole, 2,2'-bis[o-chlorophenyl]-4,4',5,5'-tetraphenyl-; CAS 1707-68-2 |
| Photomer ® 4039 | Phenol ethoxylate monoacrylate; CAS 56641-05-5; Henkel Process Chemical Company |
| PVB | Poly(vinyl butyral); Refractive Index = 1.4937 |
| Sartomer 256 | 2-(Ethoxyethoxy)ethyl acrylate; CAS 7328-17-8; Sartomer Company, West Chester, PA. |
| Sartomer 349 | Ethoxylated bisphenol A diacrylate; CAS 24447-78-7; Sartomer Company, West Chester, PA. |
| Sartomer 506 | Isobornyl acrylate; Sartomer Company, West Chester, PA. |
| TFE | Tetrafluoroethylene |
| VAc/HFP | 75:25 Poly(vinyl acetate/hexafluoropropylene); Refractive Index = 1.4384 |
| VAc/TFE (64:36) | 64:36 Poly(vinyl acetate/tetrafluoroethylene); Refractive Index = 1.4234 |
| VAc/TFE (72:28) | 72:28 Poly(vinyl acetate/tetrafluoroethylene); Refractive Index = 1.4359 |
| VAc/TFE (75:25) | 75:25 Poly(vinyl acetate/tetrafluoroethylene); Refractive Index = 1.4378 |
| VAc/TFE (79:21) | 79:21 Poly(vinyl acetate/tetrafluoroethylene); Refractive Index = 1.4440 |
| VAc/TFE (81:19) | 81:19 Poly(vinyl acetate/tetrafluoroethylene); Refractive Index = 1.4461 |
| VAc/TFE (84:16) | 84:16 Poly(vinyl acetate/tetrafluoroethylene); Refractive Index = 1.4505 |
| VAc/TFE (88:12) | 88:12 Poly(vinyl acetate/tetrafluoroethylene); Refractive Index = 1.4561 |
| VAc/TFE/EVE | Poly(vinyl acetate/tetrafluoroethylene/ethyl vinyl ether); Refractive Index for the 79:15:6 terpolymer = 1.4501; Refractive Index for the 71:19:10 terpolymer = 1.4429. |

-continued

GLOSSARY

| | |
|---|---|
| VAc/TFE/VPiv | 58:30:12 Poly(vinyl acetate/tetrafluoroethylene/vinylpivalate); Refractive Index = 1.4337 |
| Vinac ® B-100 | Poly(vinyl acetate); M.W. 350,000; CAS 9003-20-7; Air Products; Refractive Index = 1.4628 |

GENERAL PROCEDURES

Polymer Synthesis and Characterization

Fluorinated polymer were prepared as described in the examples. Inherent viscosities were measured on 0.1% by weight solutions in 2-butanone at 30° C. Monomer content is expressed in % by weight. Unless otherwise indicated vinyl acetate content was determined by saponification. TFE or HFP content was determined by difference for copolymers and by carbon and hydrogen analysis for terpolymers. The refractive indices of thin films (38 to 64 microns) of polymeric binders were measured at 3° F. with a Carl Zeiss Model 32034 Refractometer.

Film Preparation

Coating solutions without sensitizing dyes were prepared in amber bottles under yellow or red light by adding the components to the solvents while mixing with a mechanical stirrer until completely dissolved. All components were used as received from the suppliers without further purification. The sensitizing dye, JAW, was added under red light and all subsequent operations on solutions and their resulting films were performed under red light only. It should by understood that "total solids" refers to the total amount of non-volatile components in the composition even though some of the components may be non-volatile liquids rather than solids at room temperature.

A Talboy coater equipped with a doctor knife, 12 ft (3.7 m) drier set at 50°–70° C., and a laminator station was used to coat the solutions onto a 2-mil (0.05 mm) thick clear film support of polyethylene terephthalate (Mylar ® polyethylene terephthalate film). A cover sheet 0.92-mil (0.023 mm) polyethylene terephthalate was laminated to the coatings as they emerged from the drier. Coated samples were stored in black polyethylene bags at room temperature until used.

Sample Evaluation

Coated film with both the film support and coversheet intact was cut into 4×5-inch (10×13 cm) sections. The coversheet was removed, and the film was then mounted by laminating the soft, tacky coating onto a clear glass plate. The film support was left in place during exposure and processing operations. For holographic imaging exposures, the plates were clamped to a front-surface mirror with a thin layer of xylene in between. The thin layer of xylene served to optically couple the glass and mirror to the film. Holographic mirrors were recorded in the film by exposing with a collimated 514 nm argon-ion laser beam orientated perpendicular to the film surface so that the beam passed, in order, through the glass plate, coating, film support, and xylene layer and then reflected back onto itself off the mirror surface. The laser beam diameter was 2.0–3.0 cm and its intensity at the sample was about 10 mW/cm$^2$. Sixteen mirrors were recorded on each film. Exposure times for each series of mirrors ranged between about 0.1 and 20 sec, corresponding to exposure energies of about 1 to 200 mJ/cm$^2$.

After the recording the holographic mirrors, the film samples were overall exposed to ultraviolet and visible light using using the output of a Theimer-Strahler #5027 mercury-arc photopolymer lamp (Exposure Systems Corp., Bridgeport, Conn.) mounted in a Douthitt DCOP-X (Douthitt Corp., Detroit, Mich.) exposure unit. The exposed coatings were then heat processed by placing them in a conventional forced-air convection oven at 100° C. for 30 to 60 min.

The transmission spectrum of each holographic mirror was recorded from 400–700 nm using a Perkin Elmer model Lambda-9 spectrophotometer. Maximum reflection efficiency, reflection wavelength, and bandwidth at half maximum (fwhm) were determined from the transmission spectra. Photospeed was determined from plots reflection efficiency versus exposure energy by choosing the minimum energy needed to obtain maximum efficiency. Coating thickness was measured in processed and analyzed holographic mirrors using a profilometer (Sloan-Dektac Model 3030). The coating thickness, reflection wavelength, and maximum attainable reflection efficiency were used to calculate the refractive index modulation for each coating using the coupled wave theory (Kogelnik's theory).

CONTROL EXAMPLES A–D

These examples demonstrate the formation of holographic mirrors from composition containing non-fluorinated binders.

EXAMPLE A

A coating composed of 13.2 gm (66.0% by weight of total solids) Vinac ® B-100, 0.031 gm (0.16%) JAW, 0.42 gm (2.1%) MMT, 0.72 gm (3.6%) o-Cl HABI, 0.62 gm (3.1%) Sartomer 349, 1.58 gm (7.9%) NVC, and 3.40 gm (17.0) Photomer ® 4039 dissolved in a mixture of 91.6 gm of dichloromethane and 2.8 gm of methanol was prepared and coated as described in the general procedures. A 2-mil doctor knife was used for coating. A 7.1 micron thick coating was produced.

EXAMPLE B

A coating composed of 13.2 gm (66.0%) Vinac ® B-100, 0.016 gm (0.079%) JAW, 0.42 gm (2.1%) MMT, 0.67 gm (3.4%) o-Cl HABI, 0.62 gm (3.1%) Sartomer 349, 1.61 gm (8.1%) NVC, and 3.41 gm (17.1) Photomer ® 4039 dissolved in a mixture of 91.5 gm of dichloromethane and 2.9 gm of methanol was prepared and coated as described in the general procedures. A 7-mil doctor knife was used for coating. A 17.8 micron thick coating was produced.

EXAMPLE C

A composition containing 66.0% Vinac ® B-100, 0.08% JAW, 0.20% FC-430, 2.1% MMT, 3.7% o-Cl HABI, 3.0% Sartomer 349, 7.9% NVC, and 17.0% Photomer ® 4039 was extrusion die coated to produce a 26.2 micron thick coating on 2-mil Mylar ® film with a 0.92-mil Mylar ® coversheet.

EXAMPLE D

A coating composed of 6.75 gm (66.6%) PVB, 0.004 gm (0.04%) JAW, 0.22 gm (2.2%) MMT, 0.34 gm (3.4%) o-Cl HABI, 0.31 gm (3.1%) Sartomer 349, 0.82 gm (8.1%) NVC, and 1.69 gm (16.7) Photomer ® 4039 dissolved in a mixture of 53.7 gm of methanol and 2.8 gm of 2-butanone was prepared and coated as described in the general procedures. A 10-mil doctor knife was used for coating. A 15.3 micron thick coating was produced.

Thickness, refection efficiency, reflection wavelength, bandwidth (fwhw), refractive index modulation, and film speed for each of the films after imaging at 514 nm and thermal processing as described in the general procedures are shown in Table 1.

TABLE 1

|  | Example | | | |
|---|---|---|---|---|
|  | A | B | C | D |
| Thickness (microns) | 7.1 | 17.8 | 26.2 | 15.3 |
| Reflection Wavelength (nm) | 500 | 507 | 507 | 506 |
| fwhm (nm) | 18 | 16 | 18 | 10 |
| Reflection Efficiency (%) | 74.9 | 99.53 | 99.9 | 92.6 |
| Index Modulation | 0.029 | 0.031 | 0.025 | 0.021 |
| Film Speed (mJ/cm$^2$) | 20 | 20 | 20 | 70 |

EXAMPLES 1–3

These examples demonstrate the formation of holographic mirrors from compositions containing fluorinated binders.

The compositions shown in Table 2, each containing a fluorinated binder, were prepared, coated, and evaluated as described in the general procedures. An 8-mil doctor knife was used for coating. Thickness, reflection efficiency, reflection wavelength, bandwidth (fwhw), refractive index modulation, and film speed for each of the films after imaging at 514 nm and thermal processing as described in the general procedures are shown in Table 3.

TABLE 2

|  | Example | | |
|---|---|---|---|
| Ingredient, grams (wt %)[a] | 1 | 2 | 3 |
| VAc/TFE/VPiv | 4.93 (65.7) | — | — |
| VAc/HFP | — | 4.93 (65.7) | — |
| VAc/TFE/EVE[b] | — | — | 4.93 (65.7) |
| JAW | 0.01 (0.1) | 0.01 (0.1) | 0.01 (0.1) |
| FC-431 | 0.02 (0.2) | 0.02 (0.2) | 0.02 (0.2) |
| MMT | 0.23 (3.0) | 0.23 (3.0) | 0.23 (3.0) |
| o-Cl HABI | 0.23 (3.0) | 0.23 (3.0) | 0.23 (3.0) |
| Sartomer 349 | 0.23 (3.0) | 0.23 (3.0) | 0.23 (3.0) |
| NVC | 0.68 (9.0) | 0.68 (9.0) | 0.68 (9.0) |
| Photomer ® 4039 | 1.20 (16.0) | 1.20 (16.0) | 1.20 (16.0) |
| Solvents: | | | |
| 2-Butanone | 38.25 | 38.25 | 38.25 |
| Dichloromethane | 2.13 | 2.13 | 2.13 |
| Methanol | 2.13 | 2.13 | 2.13 |

[a]% by weight total solids.
[b]79:15:6 Vinyl acetate/tetrafluoroethylene/ethyl vinyl ether.

TABLE 3

|  | Example | | |
|---|---|---|---|
|  | 1 | 2 | 3 |
| Thickness (microns) | 11.5 | 10.7 | 11.1 |
| Reflection wavelength (nm) | 495 | 493 | 496 |
| fwhm (nm) | 34 | 28 | 34 |
| Reflection efficiency (%) | 99.9 | 99.9 | 99.99 |
| Index modulation | 0.057 | 0.061 | 0.075 |
| Film speed (mJ/cm$^2$) | 15 | 15 | 15 |

EXAMPLES 4–6

These examples demonstrate the formation of holographic mirrors from compositions containing fluorinated binders.

The compositions shown in Table 4, each containing a fluorinated binder, were prepared, coated, and evaluated as described in the general procedures. An 10-mil doctor knife was used for coating. Thickness, reflection efficiency, reflection wavelength, bandwidth (fwhw), refractive index modulation, and film speed for each of the films after imaging at 514 nm and thermal processing as described in the general procedures are shown in Table 5.

TABLE 4

| Component (gm) | Example | | |
|---|---|---|---|
| (%)[a] | 4 | 5 | 6 |
| Vinac ® B-100 | 0 | 0 | 13.2 (53) |
| VAc/TFE (88:12) | 6.6 (66) | 0 | 0 |
| VAc/TFE (75:25) | 0 | 6.6 (66) | 0 |
| Kynar ® 301 F | 0 | 0 | 3.3 (13) |
| Photomer ® 4039 | 1.7 (17) | 1.7 (17) | 4.3 (17) |
| Sartomer 349 | 0.30 (3) | 0.30 (3) | 0.30 (3) |
| NVC | 0.80 (8) | 0.80 (8) | 0.80 (8) |
| MMT | 0.20 (2) | 0.20 (2) | 0.50 (2) |
| o-Cl HABI | 0.37 (3.7) | 0.37 (3.7) | 0.93 (3.7) |
| JAW | 0.004 (0.03) | 0.004 (0.03) | 0.009 (0.03) |
| FC-430 | 0.02 (0.2) | 0.02 (0.2) | 0.05 (0.2) |
| Solvents: | | | |
| Dichloromethane | 38 | 38 | 95 |
| Methanol | 2 | 2 | 5 |

[a]% by weight total solids.

TABLE 5

|  | Example | | |
|---|---|---|---|
|  | 4 | 5 | 6 |
| Thickness (microns) | 19.0 | 18.2 | 17.4 |
| Reflection wavelength (nm) | 504 | 503 | 509 |
| fwhm (nm) | 24 | 28 | 19 |
| Optical density | 4.5[a] | 6.1[a] | 1.84 |
| Index modulation | 0.050 | 0.070 | 0.019 |
| Film speed, mJ/cm$^2$ | 8 | 8 | 40 |

[a]Calculated from the index modulation. The index modulation was determined by fitting the profile of the transmission spectrum to Kogelnik's coupled wave theory.

EXAMPLES 7–10

These examples demonstrate the formation of holographic mirrors from compositions containing fluorinated binders.

The compositions shown in Table 6, each containing a fluorinated binder, were prepared, coated, and evaluated as described in the general procedures. An 4-mil doctor knife was used for coating. Thickness, reflection efficiency, reflection wavelength, bandwidth (fwhw), refractive index modulation, and film speed for each of the films after imaging at 514 nm and thermal processing as described in the general procedures are shown in Table 7.

TABLE 6

|  | Example | | | |
|---|---|---|---|---|
| Component (gm) (%)[a] | 7 | 8 | 9 | 10 |
| VAc/TFE (72:28) | 17.1 (66.8) | 0 | 0 | 0 |
| VAc/TFE (79:21) | 0 | 16.5 (66.1) | 0 | 0 |
| VAc/TFE/EVE[b] | 0 | 0 | 16.3 (65.0) | 0 |
| VAc/TFE (84:16) | 0 | 0 | 0 | 16.4 (65.2) |
| Photomer ® 4039 | 4.20 (16.4) | 4.19 (16.7) | 4.31 (17.3) | 4.30 (17.1) |
| NVC | 1.94 (7.6) | 1.94 (7.7) | 2.00 (8.0) | 1.99 (7.9) |
| Sartomer 349 | 0.79 (3.1) | 0.78 (3.1) | 0.81 (3.2) | 0.80 (3.2) |

TABLE 6-continued

| Component (gm) (%)[a] | Example | | | |
|---|---|---|---|---|
| | 7 | 8 | 9 | 10 |
| MMT | 0.53 | 0.53 | 0.54 | 0.54 |
| | (2.1) | (2.1) | (2.2) | (2.2) |
| o-Cl HABI | 0.95 | 0.95 | 0.98 | 0.97 |
| | (3.7) | (3.8) | (3.9) | (3.9) |
| FC-430 | 0.062 | 0.061 | 0.063 | 0.063 |
| | (0.24) | (0.25) | (0.25) | (0.25) |
| JAW | 0.050 | 0.049 | 0.051 | 0.057 |
| | (0.19) | (0.20) | (0.20) | (0.20) |
| Solvents: | | | | |
| Dichloromethane | 116 | 114 | 114 | 115 |
| Methanol | 3.6 | 3.5 | 3.6 | 3.5 |

[a] % by weight total solids.
[b] 71:19:10 Vinyl acetate/tetrafluoroethylene/ethyl vinyl ether.

TABLE 7

| | Example | | | |
|---|---|---|---|---|
| | 7 | 8 | 9 | 10 |
| Thickness (microns) | 10.2 | 9.0 | 8.3 | 9.0 |
| Reflection wavelength (nm) | 509 | 508 | 509 | 510 |
| fwhm (nm) | 23 | 22 | 27 | 24 |
| Reflection efficiency | 99.56 | 99.15 | 99.83 | 99.44 |
| Index modulation | 0.054 | 0.055 | 0.076 | 0.059 |
| Film speed, mJ/cm$^2$ | 17 | 15 | 11 | 11 |

CONTROL EXAMPLE E

A coating solution similar in composition to those used in Examples 7-10, but containing VAc/TFE (64:36) as the binder in place of the fluorinated binders indicated in Table 6, was prepared and coated as described in the general procedures. An opaque coating, unsuitable for holographic exposure, was obtained.

EXAMPLES 11-14

These examples demonstrate the formation of holographic mirrors from compositions containing a vinyl acetate/tetrafluoroethylene binder and varying amounts of N-vinyl carbazole monomer.

The compositions shown in Table 8 were prepared, coated, and evaluated as described in the general procedures. An 4-mil doctor knife was used for coating.

Thickness, reflection efficiency, reflection wavelength, bandwidth (fwhw), refractive index modulation, and film speed for each of the films after imaging at 514 nm and thermal processing as described in the general procedures are shown in Table 9.

TABLE 8

| Component (gm) (%)[a] | Example | | | |
|---|---|---|---|---|
| | 11 | 12 | 13 | 14 |
| VAc/TFE (81:19) | 6.34 | 6.44 | 6.30 | 10.5 |
| | (64.6) | (64.6) | (64.4) | (64.7) |
| Photomer ® 4039 | 2.56 | 2.37 | 2.16 | 2.9 |
| | (26.0) | (23.8) | (22.0) | (17.8) |
| NVC | 0 | 0.21 | 0.41 | 1.32 |
| | | (2.1) | (4.2) | (8.1) |
| Sartomer 349 | 0.29 | 0.30 | 0.29 | 0.49 |
| | (3.0) | (3.0) | (3.0) | (3.0) |
| MMT | 0.22 | 0.22 | 0.22 | 0.36 |
| | (2.2) | (2.2) | (2.2) | (2.2) |
| o-Cl HABI | 0.37 | 0.38 | 0.37 | 0.62 |
| | (3.8) | (3.8) | (3.8) | (3.8) |
| FC-430 | 0.022 | 0.023 | 0.022 | 0.037 |
| | (0.23) | (0.23) | (0.23) | (0.23) |
| JAW | 0.022 | 0.023 | 0.022 | 0.057 |
| | (0.23) | (0.23) | (0.23) | (0.23) |
| Solvents: | | | | |
| Dichloromethane | 38.4 | 39 | 38.2 | 63.8 |
| Methanol | 2.0 | 2.1 | 2.0 | 3.4 |

[a] % by weight total solids.

TABLE 9

| | Example | | | |
|---|---|---|---|---|
| | 11 | 12 | 13 | 14 |
| Thickness (microns) | 6.6 | 5.9 | 6.3 | 7.1 |
| Reflection wavelength (nm) | 503 | 504 | 501 | 500 |
| fwhm (nm) | 20 | 23 | 26 | 26 |
| Reflection efficiency | 90.67 | 93.54 | 94.25 | 98.40 |
| Index modulation | 0.045 | 0.056 | 0.053 | 0.062 |
| Film speed, mJ/cm$^2$ | 14 | 14 | 9 | 14 |

EXAMPLE 15

This example illustrate the preparation of VAc/TFE/VPiv [poly(vinyl acetate/tetrafluoroethylene/vinyl pivalate)]using a shaker tube.

Vinyl acetate (68 g), vinyl pivalate (15 g), AIBN (0.15 g), methyl acetate (45 g), and t-butyl alcohol (75 g) were added to a 400 mL stainless steel shaker tube. The tube was cooled in a dry ice-acetone bath, and evacuated. TFE (40 g) was added and the tube heated at 60° C. for 2 hr. Toward the end of the reaction the temperature rose to 76° C. The tube was cooled to room temperature and the reaction mixture removed. The tube was washed with acetone. The product was precipitated by adding the combined reaction mixture and washings to cold water in a Waring blender. The product was filtered and dried to constant weight in a vacuum oven. Monomer to polymer conversion: 74%. Vinyl acetate content: 58%. TFE content 30%. Inherent viscosity: 1.32 deciliters/g.

EXAMPLE 16

This example illustrate the preparation of VAc/HFP [75:25 poly(vinyl acetate/hexafluoropropylene)] using a shaker tube.

Vinyl acetate (35 g) and AIBN (0.15 g) were added to a 400 mL shaker tube. The tube was cooled in a dry ice-acetone bath, and evacuated. HFP (100 g) was added and the tube heated at 55° C. for 5 hr. The tube was cooled to room temperature and the product removed. Vinyl acetate content: 75%. Inherent viscosity: 1.08 deciliters/g.

EXAMPLE 17

This example illustrate the preparation of VAc/TFE/EVE [poly(vinyl acetate/tetrafluoroethylene/ethyl vinyl ether] using a shaker tube.

Vinyl acetate (86 g), ethyl vinyl ether (10 g), AIBN (0.15 g), methyl acetate (30 g), and t-butyl alcohol (80 g) were added to a 400 mL shaker tube. The tube was cooled in a dry ice-acetone bath, and evacuated. TFE (10 g) was added and the tube heated at 60° C. for 2 hr. The tube was cooled to room temperature and the reaction mixture removed. The tube was washed with acetone. The product was precipitated by adding the combined reaction mixture and washings to cold water in a Waring blender. The product was filtered and dried to constant weight in a vacuum oven. Monomer conversion: about 60%. Vinyl acetate content: 79%. TFE content 15%. Inherent viscosity: 1.33 deciliters/g.

EXAMPLE 18

This example illustrates the preparation of a poly(vinyl acetate/tetrafluoroethylene) copolymer VAc/TFE] using a shaker tube. Vinyl acetate (80 g), AIBN (0.15 g), methyl acetate (20 g), and t-butyl alcohol (100 g) were added to a 400 mL shaker tube. The tube was cooled in a dry ice-acetone bath, and evacuated. TFE (19 g) was added and the tube heated at 60° C. for 4 hr. The tube was cooled to room temperature and the reaction mixture removed. The tube was washed with acetone. The combined products and washings from six identical runs were dissolved in acetone, filtered, precipitated by adding acetone solution to cold water in a Waring blender, and dried to constant weight in a vacuum oven. Yield: 432 g of polymer. Monomer conversion: 73%. Vinyl acetate content: 81%. Inherent viscosity: 1.15 deciliters/g.

EXAMPLE 19

This example illustrates the preparation of a poly(vinyl acetate/tetrafluoroethylene) copolymer [VAc/TFE] using a high pressure autoclave.

The following were added to a clean, evacuated 2 L stainless steel, high pressure autoclave equipped with a stirrer and water jacket which had been cooled to 10° C.: 400 g t-butyl alcohol, 200 g methyl acetate, 500 g vinyl acetate, and 204 g of TFE. The reactor was heated to 55° C. by circulating heated water through the reactor jacket. Twenty mL of a solution of 3.0 g of 2,2'-azobis(2,4-dimethylvaleronitrile) in 100 mL of methyl acetate was added and the reaction allowed to proceed at 54°-55° C. for 3.5 hr during which time the pressure inside the reactor dropped from 194 psig to 94 psig. Acetone (500 mL) was added and the reactor cooled to ambient temperature. The reaction mixture was removed from the reactor and the reactor washed with 1 L of acetone. The product was precipitated by adding the combined reaction mixture and washings to cold water in a Waring blender. The product was filtered and dried to constant weight in a vacuum oven. Yield 469 g. Vinyl acetate content (calculated from the carbon and hydrogen analyses): 72%.

EXAMPLE 20-21

These examples illustrate the preparation of different poly(vinyl acetate/tetrafluoroethylene) copolymers [VAc/TFE] using a high pressure autoclave.

The procedure of Example 19 was followed with the exception that 136 g of TFE was added. The pressure dropped from 140 psig to 58 psig during the reaction. Yield 389 g. Vinyl acetate content (calculated from the carbon and hydrogen analyses): 79%.

The procedure of Example 19 was followed with the exception that 70 g of TFE was added. The pressure dropped from 82 psig to 30 psig during the reaction. Monomer to polymer conversion: 68%. Vinyl acetate content: 84%. Inherent viscosity: 0.84 deciliter/g.

EXAMPLE 20-21

This example illustrate the preparation of VAc/TFE/EVE [poly(vinyl acetate/tetrafluoroethylene/ethyl vinyl ether] using a high pressure autoclave.

The following were added at ambient temperature to a clean, evacuated 1 L stainless steel, high pressure autoclave equipped with a stirrer and water jacket: 230 g t-butyl alcohol, 100 g methyl acetate, 240 g vinyl acetate, and 30 g ethyl vinyl ether. Then 40 g of TFE was added at ambient temperature causing the pressure to rise to 53 psig. The reactor was heated to 65° C. by circulating heated water through the reactor jacket. Twenty mL of a solution of 6.0 g of AIBN is 200 mL of methyl acetate was added and heating at 65° C. continued for 70 min during which time the pressure inside the reactor dropped from 83 psig to 32 psig. Acetone (300 mL) was added and the reactor cooled to ambient temperature. The reaction mixture was poured from the reactor and the reactor washed with 600 mL of acetone. The product was precipitated by adding the combined reaction mixture and washings to cold water in a Waring blender. The product was filtered and dried to constant weight in a vacuum oven. Yield: 153 g (49% conversion). Vinyl acetate content: 71.3%. Ethyl vinyl ether content (calculated from the carbon and hydrogen analyses): 19%. Inherent viscosity: 0.78 deciliter/g.

EXAMPLE 23 and CONTROL EXAMPLE F

These examples demonstrate the formation of holographic mirrors from a composition containing nonaromatic monomers and a fluorinated binder and from a composition containing nonaromatic monomers and a nonfluorinated binder.

The compositions shown in Table 8 were prepared, coated, and evaluated as described in the general procedures. A 10-mil (0.25 cm) doctor knife was used for coating Maximum exposure energy was 300 mJ/cm$^2$. Thickness, reflection efficiency, reflection wavelength, bandwidth (fwhw), refractive index modulation, and film speed for each of the films after imaging at 514 nm and thermal processing as described in the general procedures are shown in Table 9.

TABLE 8

| Ingredient, grams (wt %)$^a$ | Example 23 | F |
|---|---|---|
| VAc/TFE (79:21) | 4.93 (65.69) | — (0) |
| Vinac B-100 | — (0) | 4.93 (65.69) |
| JAW | 0.01 (0.11) | 0.01 (0.11) |
| FC-431 | 0.02 (0.20) | 0.02 (0.20) |
| MMT | 0.23 (3.0) | 0.23 (3.0) |
| o-Cl HABI | 0.23 (3.0) | 0.23 (3.0) |
| Triethylene Glycol Diacrylate | 0.23 (3.0) | 0.23 (3.0) |
| Sartomer 506 | 0.68 (9.0) | 0.68 (9.0) |
| Sartomer 256 | 1.20 (16.0) | 1.20 (16.0) |
| Solvents: | | |
| 2-Butanone | 38.25 | 38.25 |
| Dichloromethane | 2.13 | 2.13 |
| Methanol | 2.13 | 2.13 |

$^a$% by weight total solids.

TABLE 9

| | Example | |
|---|---|---|
| | 23 | F |
| Thickness (microns) | 14.2 | 15.1 |
| Reflection wavelength (nm) | 506 | 506 |
| fwhm (nm) | 9 | 6 |
| Reflection efficiency (%) | 78.5 | 19.2 |
| Index modulation | 0.016 | 0.0050 |
| Film Speed, mJ/cm$^2$ | 25 | 25 |

What is claimed is:

1. A substantially solid, transparent, photopolymerizable composition that forms a refractive-index image upon exposure to actinic radiation as the sole processing step, said composition having a refractive index modulation greater than approximately 0.01 when imaged and consisting essentially of:

(a) approximately 25 to 90% of a solvent soluble, fluorine-containing polymeric binder;
(b) approximately 5 to 60% of a liquid ethylenically unsaturated monomer, said monomer having a boiling point above 100° C. and being capable of addition polymerization;
(c) approximately 0 to 25% of a plasticizer; and
(d) approximately 0.1 to 10% of a photoinitiator system that activates polymerization of said unsaturated monomer upon exposure to actinic radiation;
wherein said percentages are weight percentages of the total composition.

2. The composition of claim 1 wherein said binder contains approximately 3 to 25% fluorine, by weight.

3. The composition of claim 1 wherein said binder contains fluorine atoms introduced by reaction of a fluorinated compound with a polymer.

4. The composition of claim 3 wherein said binder contains approximately 3 to 25% fluorine, by weight.

5. The composition of claim 1 wherein said binder contains the polymer of a fluorinated monomer and a vinyl monomer selected from the group consisting of a vinyl ester, vinyl alcohol, vinyl ether, vinyl acetal/butyral, or interpolymers or mixtures thereof.

6. The composition of claim 5 wherein the fluorinated monomer is selected from the group consisting of a perfluorinated monomer, a vinyl fluoride, a vinylidene fluoride, fluoroolefins, fluoroalkyl acrylate or methacrylate, and mixtures thereof.

7. The composition of claim 5 or 6 wherein said vinyl monomer is a vinyl acetate, vinyl butyral, vinyl acetal, vinyl butyral, vinyl acetal, vinyl formal, vinyl alcohol or mixtures or interpolymers thereof.

8. The composition of claim 5 wherein said binder contains approximately 3 to 25% fluorine, by weight.

9. The composition of claim 5 wherein another monomer is present when forming the polymer.

10. The composition of claim 1 wherein said polymeric binder contains the polymer of a vinyl ester and at least one fluorinated monomer.

11. The composition of claim 10 wherein said binder contains a polymer of vinyl acetate.

12. The composition of claim 11 wherein said binder contains approximately 3 to 25% fluorine, by weight.

13. The composition of claim 12 wherein said binder is a polymer of vinyl acetate and a perfluorinated monomer.

14. The composition of claim 13 wherein another monomer is present when forming the polymer.

15. The composition of claim 13 wherein the perfluorinated monomer is at least one of tetrafluoroethylene, hexafluoropropylene, and mixtures thereof.

16. The composition of claim 1 wherein said liquid ethylenically unsaturated monomer contains at least one moiety selected from the group consisting of phenyl, biphenyl, phenoxy, naphthyl, naphthyloxy, heteroaromatic groups containing up to three aromatic rings, chlorine, and bromine.

17. The composition of claim 16 wherein said monomer is selected from the group consisting of 2-phenoxyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, 2-(1-naphthyloxy)ethyl acrylate, o-biphenyl methacrylate, o-biphenyl acrylate, and mixtures thereof.

18. The composition of claim 16 wherein said binder contains the polymer of a fluorinated monomer and a vinyl monomer selected from the group consisting of a vinyl ester, vinyl alcohol, vinyl ether, vinyl acetal/butyral, or interpolymers or mixtures thereof.

19. The composition of claim 18 wherein the fluorinated monomer is selected from the group consisting of a perfluorinated monomer, vinyl fluoride, vinylidene fluoride, fluoroolefins, fluoroalkyl acrylates and methacrylates, and mixtures thereof.

20. The composition of claim 18 wherein said binder contains approximately 3 to 25% fluorine, by weight.

21. The composition of claim 18 wherein another monomer is present when forming the polymer.

22. The composition of claim 18 wherein said binder contains the polymer of vinyl acetate and a fluorinated monomer selected from the group consisting of a perfluorinated monomer, vinyl fluoride, vinylidene fluoride, and mixtures thereof.

23. The composition of claim 22 wherein said binder contains approximately 3 to 25% fluorine, by weight.

24. The composition of claim 23 wherein another monomer is present when forming the polymer.

25. A photosensitive element for preparing a refractive-index image by exposure to actinic radiation as the sole processing step, said element comprising a substrate that supports a substantially solid, transparent, photopolymerizable composition having a refractive index modulation greater than approximately 0.01 when imaged and consisting essentially of:
(a) approximately 25 to 90% of a solvent soluble, fluorine-containing polymeric binder;
(b) approximately 5 to 60% of a liquid ethylenically unsaturated monomer, said monomer having a boiling point above 100° C. and being capable of addition polymerization;
(c) approximately 0 to 25% of a plasticizer; and
(d) approximately 0.1 to 10% of a photoinitiator system that activates polymerization of said unsaturated monomer upon exposure to actinic radiation;
wherein said percentages are weight percentages of the total composition.

26. The element of claim 25 wherein said binder contains approximately 3 to 25% fluorine, by weight.

27. The element of claim 25 wherein said binder contains fluorine atoms introduced by reaction of a fluorinated compound with a polymer.

28. The element of claim 27 wherein said binder contains approximately 3 to 25% fluorine, by weight.

29. The element of claim 25 wherein said binder contains the polymer of a fluorinated monomer and a vinyl monomer selected from the group consisting of a vinyl ester, vinyl alcohol, vinyl ether, vinyl acetal/butyral, or interpolymers or mixtures thereof.

30. The element of claim 29 wherein the fluorinated monomer is selected from the group consisting of a perfluorinated monomer, a vinyl fluoride, a vinylidene fluoride, fluoroolefins, fluoroalkyl acrylates or methacrylates, and mixtures thereof.

31. The element of claim 29 or 30 wherein said vinyl monomer is a vinyl acetate, vinyl butyral, vinyl acetal, vinyl formal, or mixtures of interpolymers thereof.

32. The element of claim 29 wherein said binder contains approximately 3 to 25% fluorine, by weight.

33. The element of claim 29 wherein another monomer is present when forming the polymer.

34. The element of claim 25 wherein said polymeric binder contains the polymer of a vinyl ester and at least one fluorinated monomer.

35. The element of claim 34 wherein said binder contains a polymer of vinyl acetate.

36. The element of claim 35 wherein said binder contains approximately 3 to 25% fluorine, by weight.

37. The element of claim 36 wherein said binder is a polymer of vinyl acetate and a perfluorinated monomer.

38. The element of claim 37 wherein another monomer is present when forming the polymer.

39. The element of claim 37 wherein the perfluorinated monomer is at least one of tetrafluoroethylene, hexafluoropropylene, and mixtures thereof.

40. The element of claim 25 wherein said liquid ethylenically unsaturated monomer contains at least one moiety selected from the group consisting of phenyl, biphenyl, phenoxy, naphthyl, naphthyloxy, heteroaromatic groups containing up to three aromatic rings, chlorine, and bromine.

41. The element of claim 40 wherein said monomer is selected from the group consisting of 2-phenxoyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, 2-(1-naphthyloxy)ethyl acrylate, o-biphenyl methacrylate, o-biphenyl acrylate, and mixtures thereof.

42. The element of claim 40 wherein said binder contains the polymer of a fluorinated monomer and a vinyl monomer selected from the group consisting of a vinyl ester, vinyl alcohol, vinyl ether, vinyl acetal/butyral, or interpolymers or mixtures thereof.

43. The element of claim 42 wherein the fluorinated monomer is selected from the group consisting of a perfluorinated monomer, vinyl fluoride, vinylidene fluoride, and mixtures thereof.

44. The element of claim 42 wherein said binder contains approximately 3 to 25% fluorine, by weight.

45. The element of claim 42 wherein another monomer is present when forming the polymer.

46. The element of claim 42 wherein said binder contains the polymer of vinyl acetate and a fluorinated monomer selected from the group consisting of a perfluorinated monomer, vinyl fluoride, vinylidene fluoride, and mixtures thereof.

47. The element of claim 46 wherein said binder contains approximately 3 to 25% fluoride, by weight.

48. The element of claim 47 wherein another monomer is present when forming the polymer.

49. A holographic optical element comprising a transparent polymeric film containing a reflection hologram, said film having a refractive index modulation greater than approximately 0.01 and being formed by exposing to coherent light a composition consisting essentially of:
(a) approximately 25 to 90% of a solvent soluble, fluorine-containing polymeric binder;
(b) approximately 5 to 60% of a liquid ethylenically unsaturated monomer, said monomer having a boiling point above 100° C. and being capable of addition polymerization;
(c) approximately 0 to 25% of a plasticizer; and
(d) approximately 0.1 to 10% of a photoinitiator system that activates polymerization of said unsaturated monomer upon exposure to actinic radiation; wherein said percentages are weight percentages of the total film composition.

50. The element of claim 49 wherein said binder contains approximately 3 to 25% fluorine, by weight.

51. The element of claim 49 wherein said binder contains fluorine atoms introduced by reaction with the binder.

52. The element of claim 51 wherein said binder contains approximately 3 to 25% fluorine, by weight.

53. The element of claim 49 wherein said binder contains the polymer of a fluorinated monomer and a vinyl monomer selected from the group consisting of a vinyl ester, vinyl alcohol, vinyl ether, vinyl acetal/butyral, or interpolymers or mixtures thereof.

54. The element of claim 53 wherein the fluorinated monomer is selected from the group consisting of a perfluorinated monomer, a vinyl fluoride, a vinylidene fluoride, fluoroolefins, fluoroalkyl acrylates or methacrylates, and mixtures thereof.

55. The element of claim 53 or 54 wherein said vinyl monomer is a vinyl acetate, vinyl butyral, vinyl acetal, vinyl formal, or mixtures or interpolymers thereof.

56. The element of claim 53 wherein said binder contains approximately 3 to 25% fluoride by weight.

57. The element of claim 53 wherein another monomer is present when forming the polymer.

58. The element of claim 49 wherein said polymeric binder contains the polymer of a vinyl ester and at least one fluorinated monomer.

59. The element of claim 58 wherein said binder contains a polymer of vinyl acetate.

60. The element of claim 59 wherein said binder contains approximately 3 to 25% fluorine, by weight.

61. The element of claim 60 wherein said binder is a polymer of vinyl acetate and a perfluorinated monomer.

62. The element of claim 61 wherein another monomer is present when forming the polymer.

63. The element of claim 61 wherein the perfluorinated monomer is at least one of tetrafluoroethylene, hexafluoropropylene, and mixtures thereof.

64. The element of claim 49 wherein said liquid ethylenically unsaturated monomer contains at least one moiety selected from the group consisting of phenyl, biphenyl, phenoxy, naphthyl, naphthyloxy, heteroaromatic groups containing up to three aromatic rings, chlorine, and bromine.

65. The element of claim 64 wherein said monomer is selected from the group consisting of 2-phenxoyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, 2-(1-naphthyloxy)ethyl acrylate, o-biphenyl methacrylate, o-biphenyl acrylate, and mixtures thereof.

66. The element of claim 64 wherein said binder contains the polymer of a fluorinated monomer and a vinyl monomer selected from the group consisting of a vinyl ester, vinyl alcohol, vinyl ether, vinyl acetal/butyral, or interpolymers or mixtures thereof.

67. The element of claim 66 wherein the fluorinated monomer is selected from the group consisting of a perfluorinated monomer, vinyl fluoride, vinylidene fluoride, fluoroolefins, fluoroalkyl acrylates or methacrylates, and mixtures thereof.

68. The element of claim 66 wherein said binder contains approximately 3 to 25% fluorine, by weight.

69. The element of claim 66 wherein another monomer is present when forming the polymer.

70. The element of claim 66 wherein said binder contains the polymer of vinyl acetate and a fluorinated monomer selected from the group consisting of a perfluorinated monomer, vinyl fluoride, fluoroolefins, fluoroalkyl acrylates or methacrylates, vinylidene fluoride, fluoroolefine, fluoroalkyl acrylates or methacrylates, and mixtures thereof.

71. The element of claim 70 wherein said binder contains approximately 3 to 25% fluorine, by weight.

72. The element of claim 71 wherein another monomer is present when forming the polymer.

73. The element of claim 49 that is an optical combiner for a head up display.

74. The element of claim 73 having a refractive index modulation of at least approximately 0.05.

75. The composition of claim 1 or 5 imaged to contain a hologram.

* * * * *